(12) United States Patent
Lee

(10) Patent No.: US 6,703,279 B2
(45) Date of Patent: Mar. 9, 2004

(54) SEMICONDUCTOR DEVICE HAVING CONTACT OF SI-GE COMBINED WITH COBALT SILICIDE

(75) Inventor: Brian S. Lee, Hsinchu (TW)

(73) Assignee: ProMOS Technologies, Inc., Hsinchu (TW)

(*) Notice: Subject to any disclaimer, the term of this patent is extended or adjusted under 35 U.S.C. 154(b) by 0 days.

(21) Appl. No.: 10/310,904

(22) Filed: Dec. 6, 2002

(65) Prior Publication Data

US 2003/0127696 A1 Jul. 10, 2003

Related U.S. Application Data

(63) Continuation-in-part of application No. 10/035,210, filed on Jan. 4, 2002, now Pat. No. 6,521,956.

(51) Int. Cl.[7] ............................................. H01L 21/336
(52) U.S. Cl. ........................................ 438/300; 257/384
(58) Field of Search ............................ 438/300; 257/384

(56) References Cited

U.S. PATENT DOCUMENTS 6,200,895 B1 * 3/2001 Givens et al. ............... 438/688
6,238,967 B1   5/2001 Shiho et al.
6,335,249 B1 * 1/2002 Thei et al. ................... 438/296
6,429,069 B1   8/2002 Dennison et al.
6,521,956 B1 * 2/2003 Lee ............................. 257/384

* cited by examiner

Primary Examiner—David Nelms
Assistant Examiner—Tu-Tu Ho
(74) Attorney, Agent, or Firm—Birch, Stewart, Kolasch & Birch, LLP

(57) ABSTRACT

The present invention provides a metal contact of SiGe combined with cobalt silicide and cobalt. The contact resistance is greatly lowered due to both the low Schottky Barrier Height of SiGe and the low sheet resistance of cobalt silicide. The cobalt layer can serve as a glue layer and diffusion barrier layer. Thus, no additional glue layer or diffusion barrier layer needs to be formed. Moreover, the metal contact of the present invention can be integrated with a DRAM by a hybrid contact method. Implantation contact is used in pFET regions and diffusion contact is used in nFET regions. This can reduce mask steps and production costs.

40 Claims, 9 Drawing Sheets

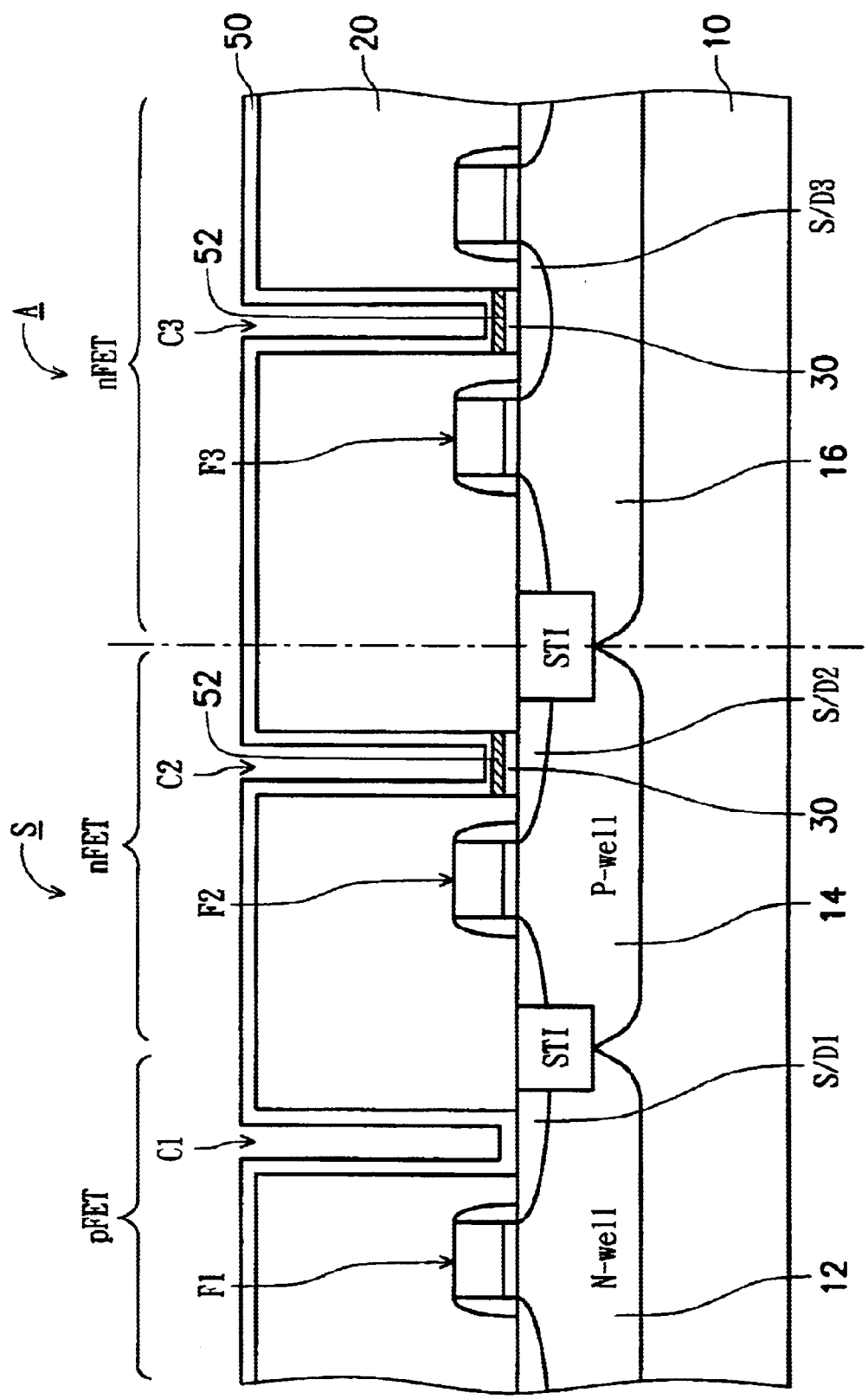

SEMICONDUCTOR DEVICE HAVING CONTACT OF SI-GE COMBINED WITH COBALT SILICIDE

This application is a continuation-in-part of application Ser. No. 10/035,210, filed on Jan. 4, 2002 now U.S. Pat. No. 6,521,956, the entire contents of which are hereby incorporated by reference.

BACKGROUND OF THE INVENTION

1. Field of the Invention

The present invention relates to a semiconductor device having a contact of SiGe combined with cobalt silicide at a metal/semiconductor interface, and more particularly to a process for fabricating low resistance contact for DRAM by a hybrid contact method.

2. Description of the Prior Art

It has been customary in modern semiconductor manufacturing technique to form MS (metal-semiconductor) contact by forming is either an Ohmic contact or a diffusion contact. The former technique is performed by implantation dopants into the MS interface layer to a concentration above solid solubility limit (i.e. $N(n,p) > 10^{20}$ cm$^{-3}$) to form a tunneling barrier. On the other hand, the latter technique is performed by diffusing dopants into the interface layer to lower the Schottky Barrier Height (SBH).

Silicon, a frequently used semiconductor, has a high intrinsic SBH (or Eg (energy gap)), Eg=1.11 eV. Therefore, when silicon is used, a relatively high doping concentration is required at the MS interface layer, which is usually performed using high-energy implantation, to lower the SBH in order to form a better contact. However, the high-energy implantation results in unwanted deep contact junctions, which subjects the device to short channel effect (SCE) or punch-through (leakage).

SUMMARY OF THE INVENTION

An object of the present invention is to solve the above-mentioned problems and provide a semiconductor device having a metal/semiconductor interface with low resistance contact and low cost.

Another object of the present invention is to provide a process to form a low resistance contact at a metal/semiconductor interface using moderate doping requirements, which in turn protects the device from short channel effect and leakage.

A further object of the present invention is to provide a process to form a metal contact for a memory device such as dynamic random access memory (DRAM) by a hybrid contact method, which can reduce mask steps and in turn cut down the production costs.

To achieve the above objects, according to a first aspect of the present invention, the semiconductor device of the present invention includes a semiconductor substrate; a dielectric layer on the semiconductor substrate, having a contact opening exposing the semiconductor substrate; a $Si_xGe_{1-x}$ layer formed within the contact opening on the semiconductor substrate, wherein 0<x<1; a cobalt silicide layer on the $Si_xGe_{1-x}$ layer; a conformal cobalt layer both on the cobalt silicide layer and on the sides of the contact opening; and a metal plug over the cobalt layer filling the contact opening.

According to a second aspect of the present invention, the process to form a metal contact for a memory device includes providing a semiconductor substrate having a first FET of a first conductivity type and a second FET of a second conductivity type in a support area and a third FET of the second conductivity type in an array area; providing a first diffusion region adjacent to the first FET, a second diffusion region adjacent to the second FET, and a third diffusion region adjacent to the third FET; forming a dielectric layer on the semiconductor substrate; respectively forming first, second, and third contact openings in the dielectric layer to the first, second, third diffusion regions; forming a doped $Si_xGe_{1-x}$ layer of a second conductivity type within the first, second, and third contact openings, wherein 0<x<1; masking the second and third contact openings; removing the doped $Si_xGe_{1-x}$ layer within the first contact opening; implantation a dopant of a first conductivity type into the first diffusion region; conformally forming a cobalt layer over the semiconductor substrate; transforming the cobalt layer into a cobalt silicide layer by reacting the cobalt layer with the underlying $Si_xGe_{1-x}$ layer in the second and third contacting openings; diffusing the dopant in the doped $Si_xGe_{1-x}$ layer within the second and third contact openings into the second and third diffusion regions; and filling a metal plug into the first, second, and third contact openings.

According to a third aspect of the present invention, the process to form a metal contact for a dynamic random access memory (DRAM) includes providing a semiconductor substrate having a pFET and an nFET in a support area and an nFET in an array area; providing a first source/drain region adjacent to the pFET in the support area, a second source/drain region adjacent to the nFET in the support area, and a third source/drain region adjacent to the nFET in the array area; forming a dielectric layer on the semiconductor substrate; respectively forming first, second, and third contact openings in the dielectric layer to the first, second, third source/drain regions; forming an n-doped $Si_xGe_{1-x}$ layer within the first, second, and third contact openings, wherein 0<x<1; masking the second and third contact openings; removing the n-doped $Si_xGe_{1-x}$ layer within the first contact opening; implantation a p-type dopant into the first source/drain region; conformally forming a cobalt layer over the semiconductor substrate; transforming the cobalt layer into a cobalt silicide layer by reacting the cobalt layer with the underlying $Si_xGe_{1-x}$ layer in the second and third contacting openings; diffusing the n-type dopant in the n-doped $Si_xGe_{1-x}$ layer within the second and third contact openings into the second and third source/drain regions; and filling a metal plug into the first, second, and third contact openings.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 2a to 2g are cross-sections illustrate the process flow of fabricating a DRAM by a hybrid contact method according to a second embodiment of the present invention.

DETAILED DESCRIPTION OF THE PREFERRED EMBODIMENTS

Figure 1A:
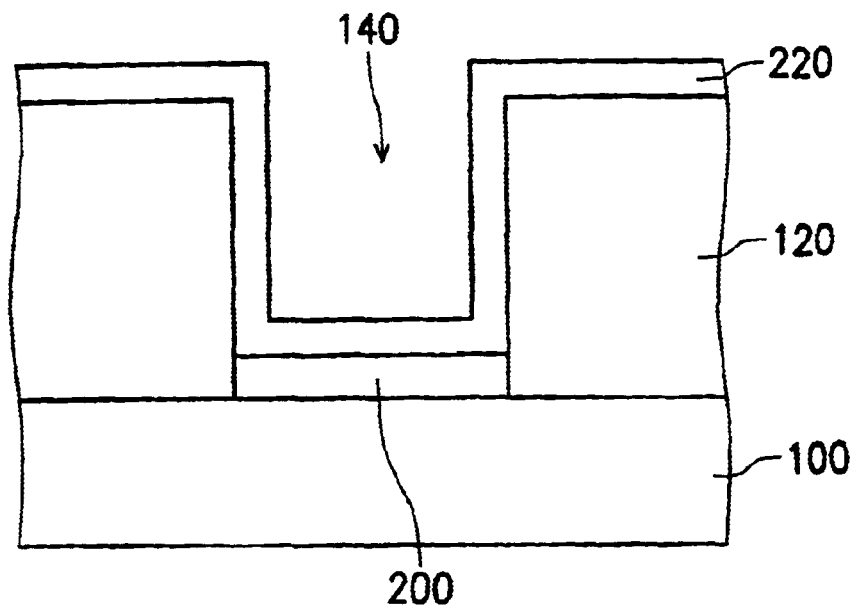
FIGS. 1a to 1c are cross-sections illustrate the process flow of fabricating a metal contact at a metal/semiconductor interface according to a first preferred embodiment of the present invention.
Figure 1B:
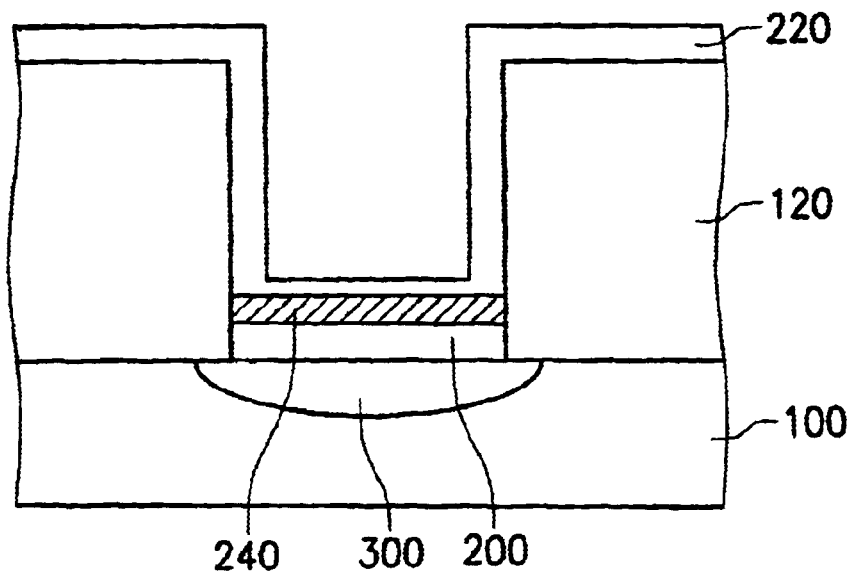
Figure 1C:
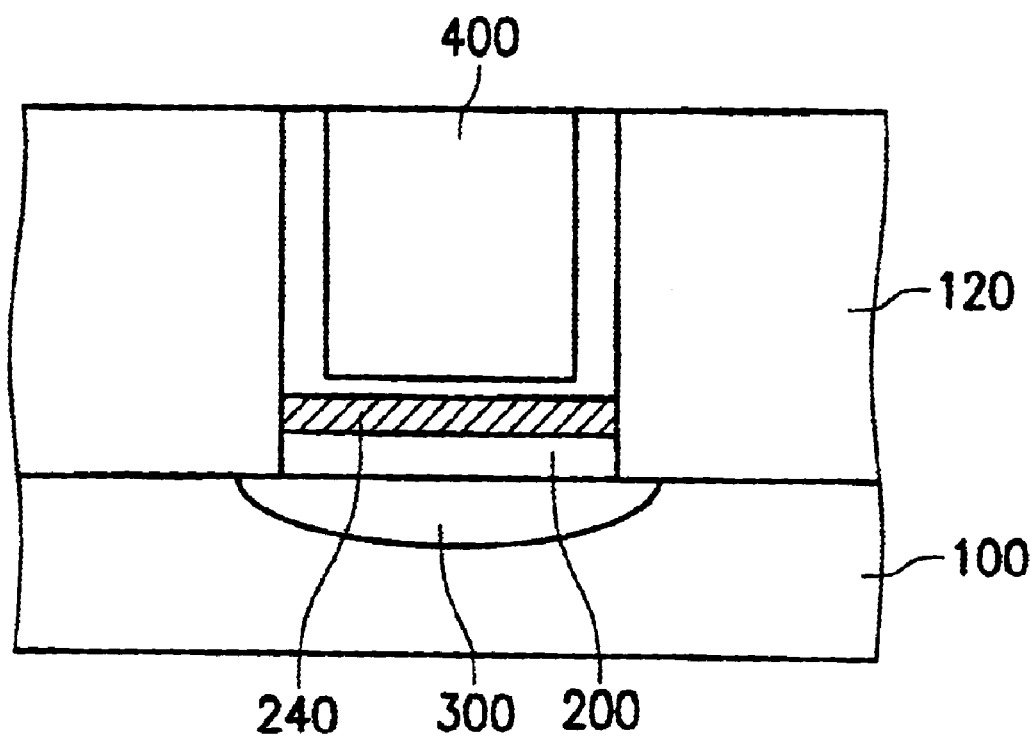

FIGS. 1a to 1c illustrate the process flow of fabricating a metal contact at a metal/semiconductor interface according to a first preferred embodiment of the present invention.

Referring to FIG. 1a, a dielectric layer 120 is formed on a semiconductor substrate 100. A contact opening 140 is formed in the dielectric layer 120 to expose the semiconductor substrate 100. Next, a $Si_xGe_{1-x}$ layer 200 (0<x<1) is formed in the contact opening 140. Next, a cobalt layer 220 is conformally formed on the semiconductor substrate 100.

Preferably, the $Si_xGe_{1-x}$ layer 200 is a doped, and more preferably, an n-doped $Si_xGe_{1-x}$ layer.

The $Si_xGe_{1-x}$ 200 can be formed by a variety of methods, such as MBE (molecular beam epitaxy), UHV-CVD (ultra-high vacuum chemical vapor deposition), RT-CVD (rapid thermal CVD), and LRP-CVD (limited reaction processing CVD). For example, the $Si_xGe_{1-x}$ layer 200 can be formed by selective epitaxial growth at a relatively low temperature range (<800° C).

For $Si_xGe_{1-x}$ layer 200, the stoichiometric ratio, x, can be optimized based on process options, tools, and subsequent layers. However, the $Si_xGe_{1-x}$ layer 200 is preferably a silicon-rich $Si_xGe_{1-x}$ layer, which has properties closer to those of pure silicon. This causes less chance of dislocation. For example, x is preferably in the range of 0.5<x<0.95.

It has been reported that a thin layer of SiGe thinner than a critical thickness, which varies depending upon its stoichiometry and deposition conditions, does not cause a dislocation in silicon substrate even with high temperature post processes. Therefore, it shall be noted that the $Si_xGe_{1-x}$ layer 200 thickness should be controlled to be less than the critical thickness to maintain it as a strained state not to cause dislocation in silicon substrate due to its lattice mismatch between silicon and SiGe, otherwise the junction will be leaky. However, in the present invention, the $Si_xGe_{1-x}$ layer 200 will be consumed in the subsequent silicidation process. Therefore, the $Si_xGe_{1-x}$ layer 200 thickness should be thick enough to compensate the consumed portion in the future. The $Si_xGe_{1-x}$ layer 200 can have a thickness of 10 to 30 nm.

The conformal cobalt layer 220 can be deposited either by physical vapor deposition (PVD) or chemical vapor deposition (CVD) in a non-selective manner over the semiconductor substrate 100. The cobalt layer 220 can serve as a glue layer to the dielectric layer 120 (interlayer dielectric; ILD), and at the is same time, a diffusion barrier layer. Therefore, no additional glue layer or diffusion barrier layer needs to be formed.

Subsequently, referring to FIG. 1b, annealing is conducted to transform the cobalt layer 220 into a cobalt silicide layer 240. In this preferred embodiment, the $Si_xGe_{1-x}$ layer 200 is selectively formed on the bottom of the contact opening 140. Therefore, only the cobalt layer 220 at the bottom of the contact opening 140 transforms into the cobalt silicide layer 240 by the reaction of cobalt and silicon in the $Si_xGe_{1-x}$ layer 200, while the cobalt layer 220 on the sidewall of the contact opening 140 remains intact.

When the $Si_xGe_{1-x}$ layer 200 is doped, the dopant can diffuse into the semiconductor substrate 100 during annealing. A diffusion region 300 is thus formed in the substrate 100 under the $Si_xGe_{1-x}$ layer 200. This can further reduce the contact resistance.

Finally, referring to FIG. 1c, a metal plug 400 is filled on the cobalt layer 220 into the contact opening 140. For example, a tungsten layer is formed by selective tungsten deposition. Then, chemical mechanical polishing (CMP) is performed to planarize the tungsten layer and remove the cobalt layer 220 on the dielectric layer 120.

Figure 2A:
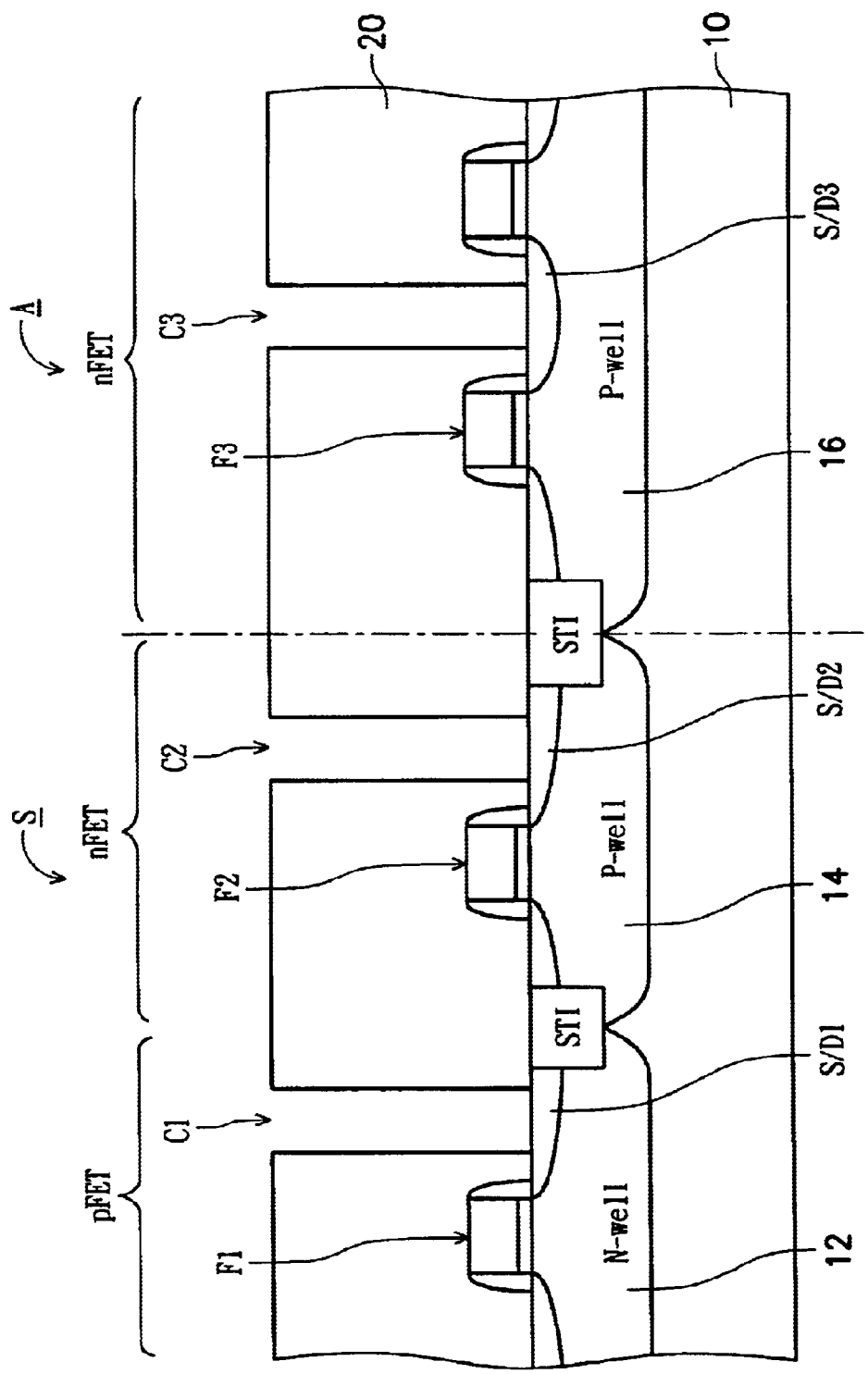

The metal contact of the present invention can be readily integrated with a memory device, preferably a DRAM device. FIGS. 2a to 2g illustrate the process flow of fabricating a DRAM by a hybrid contact method according to a second embodiment of the present invention. Now refer to FIG. 2a, showing a starting semiconductor substrate 10, which is divided by a dotted line into a support area (peripheral circuit area) labeled to S and an array area (memory array area labeled to A. The support area S and array area A are electrically isolated by shallow trench isolation (STI). In the support area S, a pFET (p-type field effect transistor) F1 and an nFET F2 are respectively formed on an N-well 12 and on a P-well 14, and these two wells 12 and 14 are also electrically isolated by STI. In the array area A, an nFET F3 is formed on a P-well 16. A source/drain region (S/D1) is formed adjacent to the pFET (F1), a source/drain region (S/D2) is formed adjacent to the nFET (F2), and a source/drain region (S/D3) is formed adjacent to the nFET (F3).

Still referring to FIG. 2a, subsequently, a dielectric layer 20 is formed on the substrate 10. Next, a first contact opening C1 to the S/D1 in the pFET region of the support area S, a second contact opening C2 to the S/D2 in the nFET region of the support area S, and a third contact opening C3 to the S/D in the nFET region of the array area A are formed.

Figure 2B:
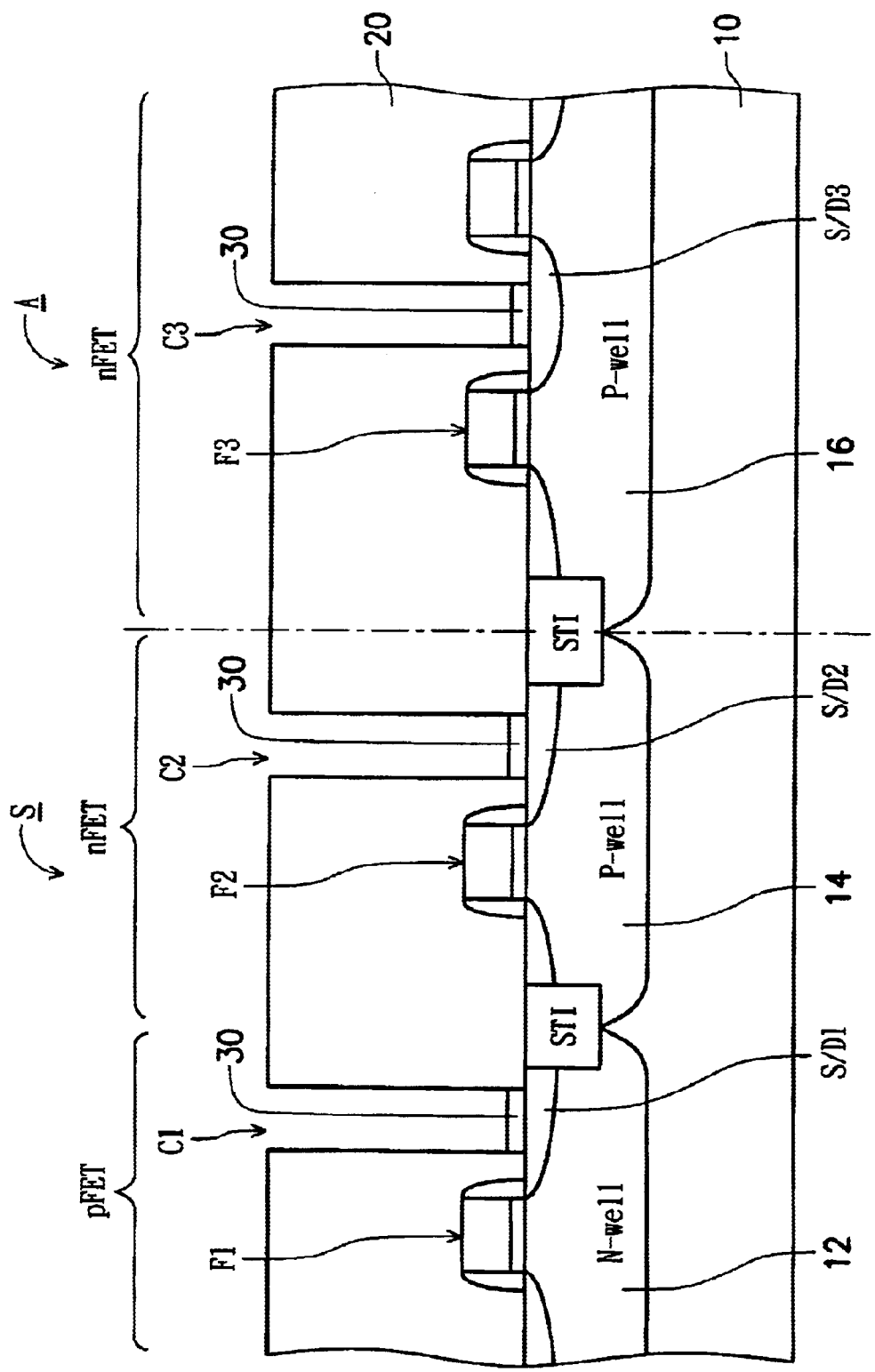

Subsequently, referring to FIG. 2b, an n-doped $Si_xGe_{1-x}$ layer 30 (0<x<1) is formed within the contact openings C1, C2, and C3.

Figure 2C:
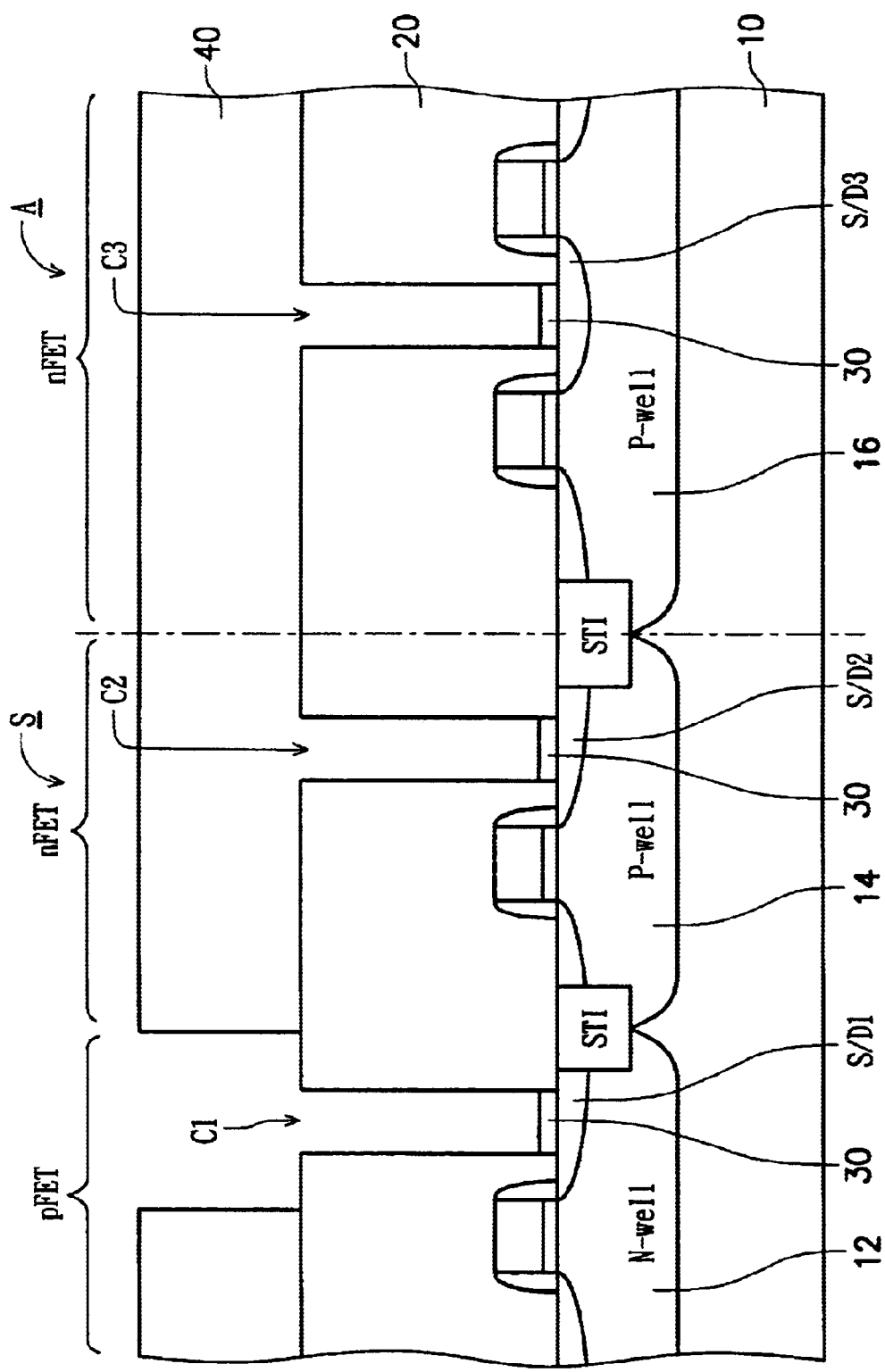

Subsequently, referring to FIG. 2c, a photoresist layer 40 is formed to mask the nFET region both in the support area S and the array area A, that is, to mask the contact openings C2 and C3. The n-doped $Si_xGe_{1-x}$ layer 30 in the contact opening C1 is exposed.

Figure 2D:
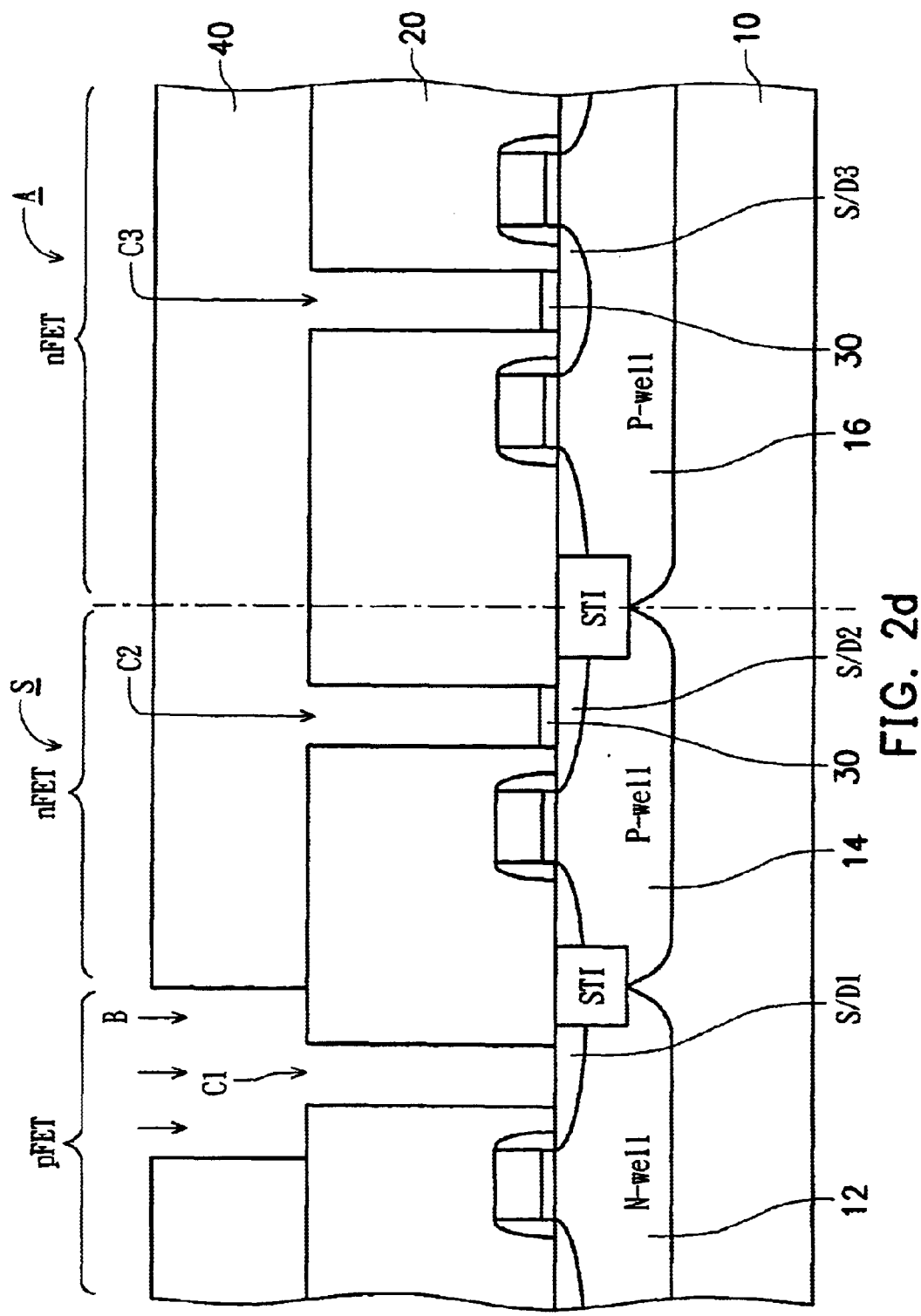

Subsequently, an implantation contact method is used for the pFET region. Referring to FIG. 2d, the n-doped $Si_xGe_{1-x}$ layer 30 in the contact opening C1 is removed. Next, the substrate 10 is subjected to implantation, that is, a p-type dopant such as boron or boron fluoride is implanted into the source/drain region S/D1 through the contact opening C1. Alternatively, implantation can be performed before the SiGe layer removal. In this step, $Si_xGe_{1-x}$ acts as a sacrificial buffer layer during implementation to prevent excess implantation of dopants into Si substrate. The sacrificial buffer layer also prevent channeling effect during implantation step, thus prevent unwanted deeper implantation of dopants into Si substrate making the contact shallower. As a consequence of additional sacrificial layer and the sacrificial buffer layer also enables high energy, high dose implantation or like implantation methods, such as plasma doping, SADS (silicide as a doping source), ion mixing, without making deeper implantation of dopants into Si than otherwise not feasible. The high-energy implantation option makes the implantation throughput higher, thus makes the manufacturing cost lower. The energy and dose of implantation are optimized such that the dopant distribution is localized in a vicinity of the substrate surface. For example, the implantation can be conducted at a low energy (100 eV to 10 KeV) and low dose (1E14 atoms/cm$^2$ to 1E15 atoms/cm$^2$), or preferably conducted at a high energy (20 KeV to 80 KeV) and low dose (5E14 atoms/cm$^2$ to 3E15 atoms/cm$^2$). Alternatively, the implantation can be conducted by an ion mixing method. That is, a low energy (100 eV to 10 KeV) and high dose ($1\times10^{14}$ to $1\times10^{16}$ atoms/cm$^2$) implantation is conducted, then, a high energy (20 KeV to 80 KeV) and low dose (5E13 to 5E14 atoms/cm$^2$) is conducted. Preferably, the implantation can be conducted at an energy less than 2 KeV and a dose less than $1\times10^{15}$ atoms/cm$^2$, which can be performed by PLAD (plasma doping) or by PIII (plasma ion immersion implantation). Next, a rapid thermal process (RTP) can be performed to anneal the implanted species and substrate damages, for example, heating at 1050° C. for 10 seconds.

Figure 2E:
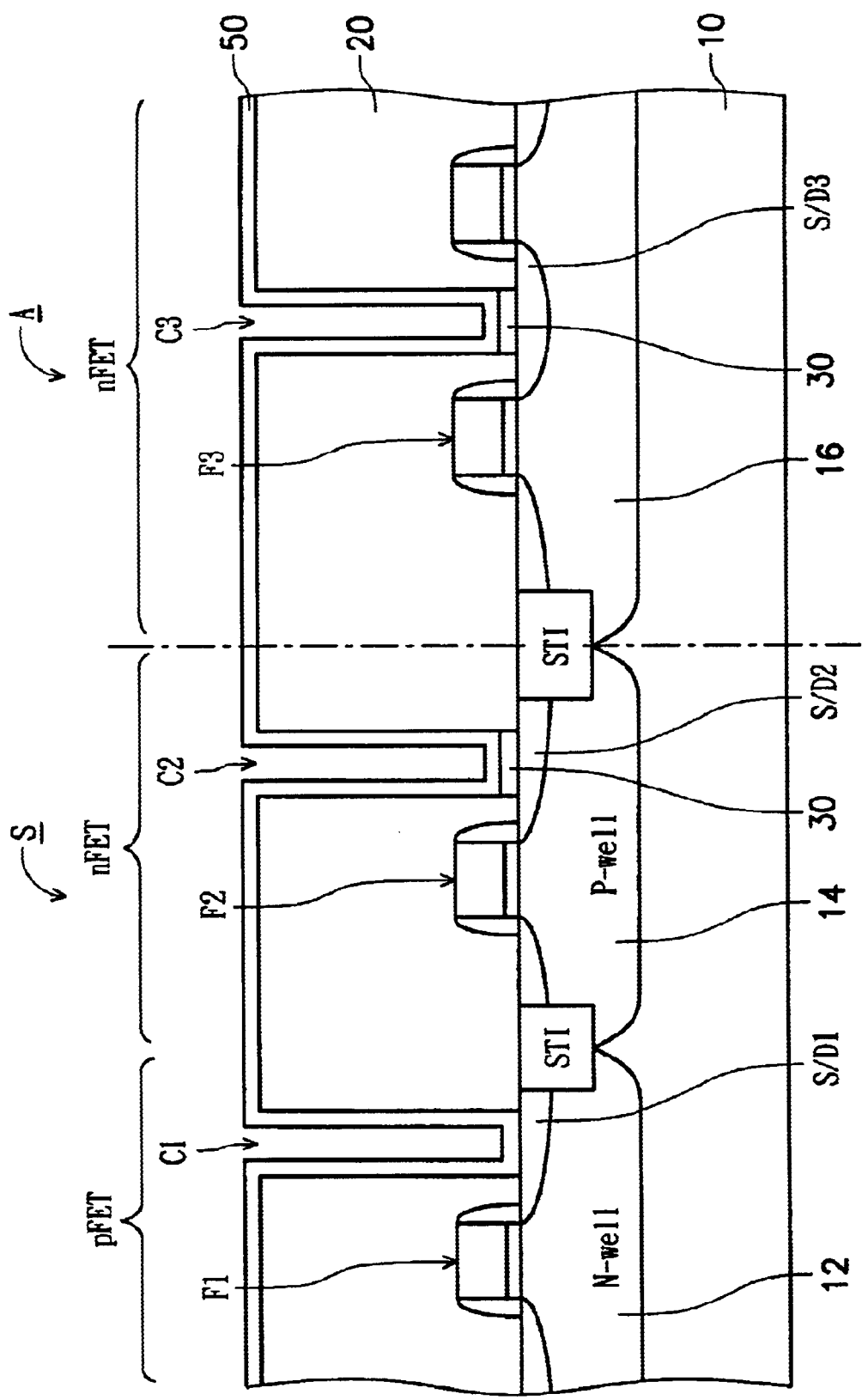

Subsequently, referring to FIG. 2e, a blanket cobalt layer 50 is conformally deposited, either by PVD or CVD in a non-selective manner over the semiconductor substrate 10. The cobalt layer 50 can serve as a glue layer to the dielectric layer 20 (interlayer dielectric; ILD), and at the same time, serve as a diffusion barrier layer.

Subsequently, referring to FIG. 2f, the substrate 10 is subjected to thermal treatment such as annealing to transform the cobalt layer 50 into a cobalt silicide layer 52. At this stage, the n-doped $Si_xGe_{1-x}$ layer 30 is still present on the bottom of the contact openings C2 and C3, but has already been removed within the contact opening C1. Therefore, only the cobalt layer 50 at the bottom of the contact openings C2 and C3 transforms into the cobalt silicide layer 52 by the reaction of cobalt and silicon in the underlying n-doped $Si_xGe_{1-x}$ layer 30. The cobalt layer 50 on the sidewall of the contact openings C2 and C3 and within the contact opening C1 remains intact.

When the first annealing (RTP) is performed to anneal the implanted species and substrate damages and the second annealing is performed to transform cobalt into cobalt silicide, a diffusion contact procedure concurrently occurs in the nFET region. Still referring to FIG. 2f, in the nFET region both in the support area S and array area A, the n-type dopant (As or P) in the n-doped $Si_xGe_{1-x}$ layer 30 within the contacting openings C2 and C3 can diffuse into the second and third source/drain regions (S/D2 and S/D3) during annealing. Thus, the SBH is lowered and an Ohmic contact is formed in the nFET region.

Figure 2G:
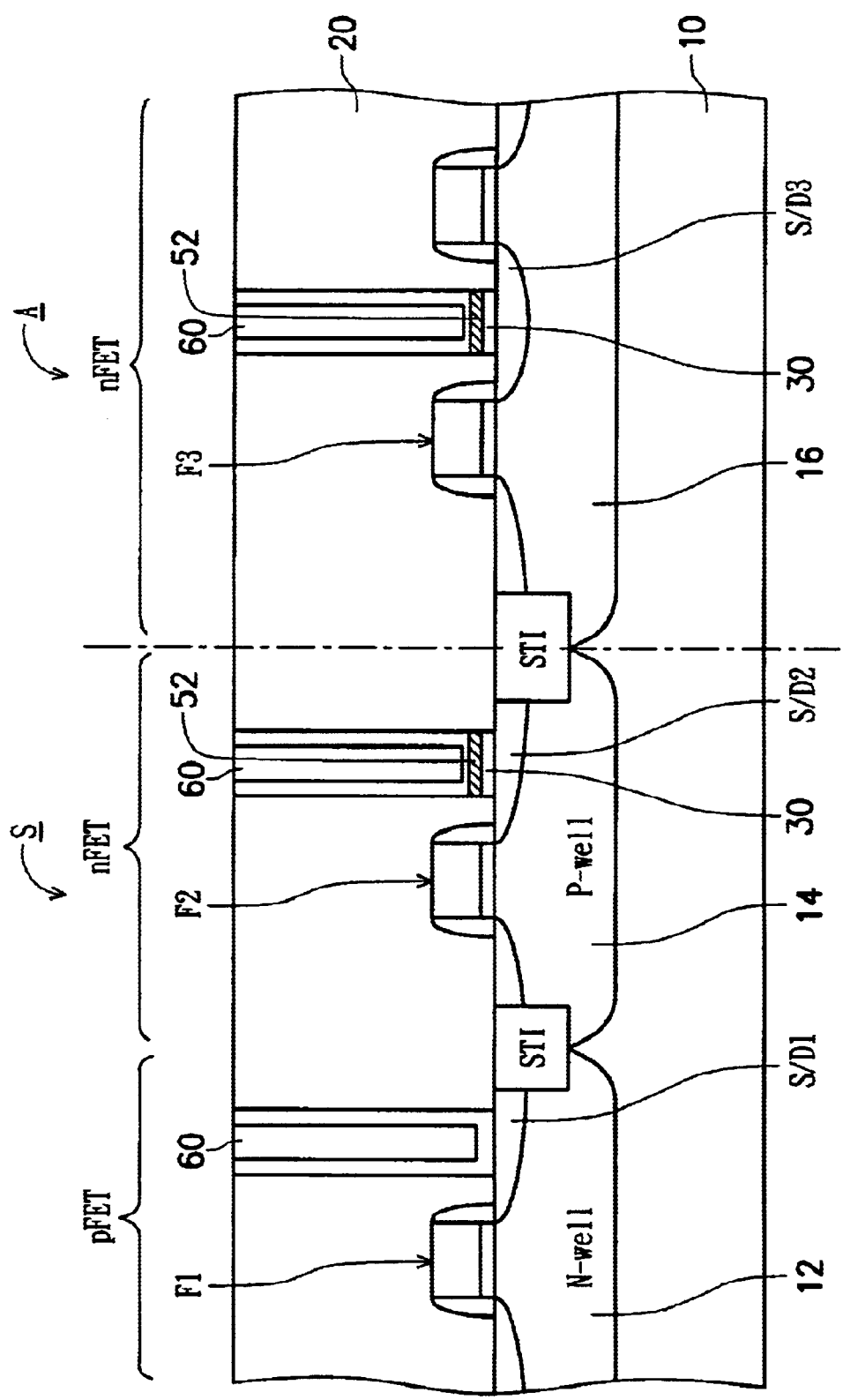

Finally, referring to FIG. 2g, a metal plug 60 is filled on the cobalt layer 50 into the contact openings C1, C2, and C3. For example, a tungsten layer is formed by selective tungsten deposition. Then, chemical mechanical polishing (CMP) is performed to planarize the tungsten layer and remove the cobalt layer 50 on the dielectric layer 20.

In the present invention, n-doped SiGe was selectively deposited only within the contact openings C1, C2, and C3. However, the role of SiGe in the contact openings C2 and C3 in nFET is completely different from that in C1 in p-FET. In the contact openings C2 and C3 (n-FET), the SiGe acts as a raised contact, and the structure will be remained in a final device structure as an integrated part of device. Thus, the present invention renders high performance device characteristics by forming low resistance raised contact, without causing damage on the S/D region and suppressing both standby leakage current and junction leakage current (by SCE), which occurs on SiGe raised S/D structure.

At the same time, the SiGe in the contact opening C1 (p-FET) has a completely different function; it acts as a sacrificial buffer layer, which enables low resistance contact by a variety of implantation methods. This sacrificial SiGe in C1 will be removed after implantation step, but before Co deposition step. SiGe acts as a sacrificial buffer layer in the contact opening C1 (pFET) during implantation to prevent excess implantation of dopants into Si substrate. The sacrificial buffer layer also prevent channeling effect during implantation step, thus preventing unwanted deeper implantation of dopants into Si substrate making the contact shallower. As a consequence of additional sacrificial layer and The sacrificial buffer layer also enables high energy, high dose implantation or like implantation methods, such as plasma doping, SADS (silicide as a doping source), ion mixing, without making deeper implantation of dopants into Si than otherwise not feasible. The high-energy implantation option makes the implantation throughput higher, thus makes the manufacturing cost lower.

In conclusion, the advantages of the present invention can be summarized below.

(1) The present invention uses a $Si_xGe_{1-x}$ layer, a cobalt silicide layer, combined with a cobalt layer to form a contact at a metal/semiconductor interface. Due to the low SBH of the $Si_xGe_{1-x}$ layer and low sheet resistance of the cobalt silicide layer, the contact resistance can be greatly lowered. Thus, a good contact at the metal/semiconductor interface can be formed using moderate doping requirements. This in turn protects the device from short channel effect and leakage.

(2) The cobalt layer serves as a glue layer and barrier diffusion layer concurrently. Thus, no additional complex glue layer and barrier diffusion layer are needed, thereby reducing production costs.

(3) By means of forming an n-doped $Si_xGe_{1-x}$ layer as the contact in the nFET region, the present invention can use a diffusion contact method to form contact. Whereas, in the pFET region, implantation contact method is used. Thus, the present invention uses a hybrid contact method. This can reduce mask steps and production costs and needs only one mask compared with the conventional process, which needs two masks respectfully for p-FET and n-FET contacts inplantation.

(4) Concurrently, an n-doped SiGe layer is used as a sacrificial buffer layer during implantation enabling alternative implantation methods without causing unwanted deeper implantation of p-dopants into Si substrate at a lower manufacturing cost.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process to form a metal contact for a memory device, comprising the following steps:

providing a semiconductor substrate having a first FET of a first conductivity type and a second FET of a second conductivity type in a support area and a third FET of the second conductivity type in an array type;

providing a first diffusion region adjacent to the first FET, a second diffusion region adjacent to the second FET, and a third diffusion region adjacent to the third FET;

forming a dielectric layer on the semiconductor substrate;

respectively forming first, second, and third contact openings in the dielectric layer to the first, second, third diffusion regions;

forming a doped $Si_xGe_{1-x}$ layer of a second conductivity type within the first, second, and third contact openings, wherein 0<x<1;

masking the second and third contact openings;

removing the doped $Si_xGe_{1-x}$ layer within the first contact opening;

implantation a dopant of a first conductivity type into the first diffusion region;

conformally forming a cobalt layer over the semiconductor substrate;

transforming the cobalt layer into a cobalt silicide layer by reacting the cobalt layer with the underlying $Si_xGe_{1-x}$ layer in the second and third contacting openings; and filling a metal plug into the first, second, and third contact openings.

2. The process as claimed in claim 1, after implantation the dopant into the first diffusion region and before forming the cobalt layer, further comprising:

performing a rapid thermal process (RTP).

3. The process as claimed in claim 1, after implantation the dopant into the first diffusion region and before filling the metal plug, further comprising:

diffusing the dopant in the doped $Si_xGe_{1-x}$ layer within the second and third contact openings into the second and third diffusion regions.

4. The process as claimed in claim 1, wherein the first conductivity type is p-type, and the second conductivity type is n-type.

5. The process as claimed in claim 1, wherein in the step of implantation a dopant of a first conductivity type into the first diffusion region, the dopant of the first conductivity type is boron.

6. The process as claimed in claim 5, wherein the implantation is conducted at an energy less than 2 KeV and a dose less than $1\times10^{15}$ atoms/cm$^2$.

7. The process as claimed in claim 6, wherein the implantation is conducted by plasma doping (PLAD).

8. The process as claimed in claim 6, wherein the implantation is conducted by PIII (plasma ion immersion implantation).

9. The process as claimed in claim 1, wherein the doped $Si_xGe_{1-x}$ layer is an n-doped $Si_xGe_{1-x}$ layer.

10. The process as claimed in claim 9, wherein the $Si_xGe_{1-x}$ layer is formed by selective epitaxial growth.

11. The process as claimed in claim 1, wherein the metal plug is a tungsten plug formed by selective tungsten deposition.

12. A process to form a metal contact for a memory device, comprising the following steps:

providing a semiconductor substrate having a first FET of a first conductivity type and a second FET of a second conductivity type in a support area and a third FET of the second conductivity type in an array area;

providing a first diffusion region adjacent to the first FET, a second diffusion region adjacent to the second FET, and a third diffusion region adjacent to the third FET;

forming a dielectric layer on the semiconductor substrate;

respectively forming first, second, and third contact openings in the dielectric layer to the first, second, third diffusion regions;

forming a doped $Si_xGe_{1-x}$ layer of a second conductivity type within the first, second, and third contact openings, wherein 0<x<1;

masking the second and third contact openings;

implantation a dopant of a first conductivity type into the first diffusion region;

removing the doped $Si_xGe_{1-x}$ layer within the first contact opening;

conformally forming a cobalt layer over the semiconductor substrate;

transforming the cobalt layer into a cobalt silicide layer by reacting the cobalt layer with the underlying $Si_xGe_{1-x}$ layer in the second and third contact openings; and filling a metal plug into the first, second, and third contact openings.

13. The process as claimed in claim 12, after removing the doped $Si_xGe_{1-x}$ layer within the first contact opening and before forming the cobalt layer, further comprising:

performing a rapid thermal process (RTP).

14. The process as claimed in claim 12, after removing the doped $Si_xGe_{1-x}$ layer within the first contact opening and before filling the metal plug, further comprising:

diffusing the dopant in the doped $Si_xGe_{1-x}$ layer within the second and third contact openings into the second and third diffusion regions.

15. The process as claimed in claim 12, wherein the first conductivity type is p-type, and the second conductivity type is n-type.

16. The process as claimed in claim 12, wherein in the step of implantation a dopant of a first conductivity type into the first diffusion region, the dopant of the first conductivity type is boron.

17. The process as claimed in claim 16, wherein the implantation is conducted at an energy less than 2 KeV and a dose less than $1\times10^{15}$ atoms/cm$^2$.

18. The process as claimed in claim 17, wherein the implantation is conducted by plasma doping (PLAD).

19. The process as claimed in claim 17, wherein the implantation is conducted by PIII (plasma ion immersion implantation).

20. The process as claimed in claim 12, wherein the doped $Si_xGe_{1-x}$ layer is an n-doped $Si_xGe_{1-x}$ layer.

21. The process as claimed in claim 20, wherein the $Si_xGe_{1-x}$ layer is formed by selective epitaxial growth.

22. The process as claimed in claim 12, wherein the metal plug is a tungsten plug formed by selective tungsten deposition.

23. A process to form a metal contact for a dynamic random access memory (DRAM), comprising the following steps:

providing a semiconductor substrate having a pFET and an nFET in a support area and an nFET in an array area;

providing a first source/drain region adjacent to the pFET in the support area, a second source/drain region adjacent to the nFET in the support area, and a third source/drain region adjacent to the nFET in the array area;

forming a dielectric layer on the semiconductor substrate;

respectively forming first, second, and third contact openings in the dielectric layer to the first, second, third source/drain regions;

forming an n-doped $Si_xGe_{1-x}$ layer layer within the first, second, and third contact openings, wherein 0<x<1;

masking the second and third contact openings;

removing the n-doped $Si_xGe_{1-x}$ layer within the first contact opening;

implantation a p-type dopant into the first source/drain region;

conformally forming a cobalt layer over the semiconductor substrate;

transforming the cobalt layer into a cobalt silicide layer by reacting the cobalt layer with the underlying $Si_xGe_{1-x}$ layer in the second and third contact openings; and filling a metal plug into the first, second, and third contact openings.

24. The process as claimed in claim 23, after implantation the p-type dopant into the first source/drain region and before forming the cobalt layer, further comprising:

performing a rapid thermal process (RTP).

25. The process as claimed in claim 23, after implantation the p-type dopant into the first source/drain region and before filling the metal plug, further comprising:

diffusing the n-type dopant in the n-doped $Si_xGe_{1-x}$ layer within the second and third openings into the second and third source/drain region.

26. The process as claimed in claim 23, wherein in the step of implantation a p-type dopant into the first source/drain region, the p-type dopant is boron.

27. The process as claimed in claim 26, wherein the implantation is conducted at an energy less than 2 KeV and a dose less than $1\times10^{15}$ atoms/cm$^2$.

28. The process as claimed in claim 27, wherein the implantation is conducted by plasma doping (PLAD).

29. The process as claimed in claim 27, wherein the implantation is conducted by PIII (plasma ion immersion implantation).

30. The process as claimed in claim 23, wherein the n-doped $Si_xGe_{1-x}$ layer is formed by selective epitaxial growth.

31. The process as claimed in claim 23, wherein the metal plug is a tungsten plug formed by selective tungsten deposition.

32. A process to form a metal contact for a dynamic random access memory (DRAM), comprising the following steps:

providing a semiconductor substrate having a pFET and an nFET in a support area and an nFET in an array area;

providing a first source/drain region adjacent to the pFET in the support area, a second source/drain region adjacent to the nFET in the support area, and a third source/drain region adjacent to the nFET in the array area;

forming a dielectric layer on the semiconductor substrate;

respectively forming first, second, and third contact openings in the dielectric layer to the first, second, third source/drain regions;

forming an n-doped $Si_xGe_{1-x}$ layer within the first, second, and third contact openings, wherein 0<x<1;

masking the second and third contact openings;

implantation a p-type dopant into the first source/drain region;

removing the n-doped $Si_xGe_{1-x}$ layer within the first contact opening;

conformally forming a cobalt layer over the semiconductor substrate;

transforming the cobalt layer into a cobalt silicide layer by reacting the cobalt layer with the underlying $Si_xGe_{1-x}$ layer in the second and third contact openings; and filling a metal plug into the first, second, and third contact openings.

33. The process as claimed in claim 32, after removing the n-doped $Si_xGe_{1-x}$ layer within the first contact opening and before forming the cobalt layer, further comprising:

performing a rapid thermal process (RTP).

34. The process as claimed in claim 32, after removing the n-doped $Si_xGe_{1-x}$ layer within the first contact opening and before filling the metal plug, further comprising:

diffusing the n-type dopant in the n-doped $Si_xGe_{1-x}$ layer within the second and third openings into the second and third source/drain regions.

35. The process as claimed in claim 32, wherein in the step of implantation a p-type dopant into the first source/drain region, the p-type dopant is boron.

36. The process as claimed in claim 35, wherein the implantation is conducted at an energy less than 2 KeV and a dose less than $1\times10^{15}$ atoms/cm$^2$.

37. The process as claimed in claim 35, wherein the implantation is conducted by plasma doping (PLAD).

38. The process as claimed in claim 36, wherein the implantation is conducted by PIII (plasma ion immersion implantation).

39. The process as claimed in claim 32, wherein the n-doped $Si_xGe_{1-x}$ layer is formed by selective epitaxial growth.

40. The process as claimed in claim 32, wherein the metal plug is a tungsten plug formed by selective tungsten deposition.

* * * * *